United States Patent [19]
Lee

[11] Patent Number: 5,593,928
[45] Date of Patent: Jan. 14, 1997

[54] METHOD OF MAKING A SEMICONDUCTOR DEVICE HAVING FLOATING SOURCE AND DRAIN REGIONS

[75] Inventor: Jeung S. Lee, Chungcheongbuk-do, Rep. of Korea

[73] Assignee: LG Semicon Co., Ltd., Chungcheongbuk-do, Rep. of Korea

[21] Appl. No.: 158,763

[22] Filed: Nov. 30, 1993

[51] Int. Cl.⁶ .......................... H01L 21/265; H01L 21/70; H01L 27/00; H01L 21/20
[52] U.S. Cl. .................. 437/41; 437/56; 437/90
[58] Field of Search ................ 437/41, 56, 89, 437/90, 41 CS

[56] References Cited

U.S. PATENT DOCUMENTS

| | | | |
|---|---|---|---|
| 4,820,654 | 4/1989 | Lee | 437/90 |
| 4,910,165 | 3/1990 | Lee et al. | 437/90 |
| 5,017,998 | 5/1991 | Miura et al. | |
| 5,040,037 | 8/1991 | Yamaguchi et al. | |
| 5,100,830 | 3/1992 | Morita | 437/89 |
| 5,116,768 | 5/1992 | Kawamura | |
| 5,188,973 | 2/1993 | Omura et al. | |
| 5,191,397 | 3/1993 | Yoshida | |
| 5,266,517 | 11/1993 | Smayling et al. | 437/89 |

*Primary Examiner*—Mary Wilczewski
*Assistant Examiner*—Brian K. Dutton
*Attorney, Agent, or Firm*—Morgan, Lewis and Bockius LLP

[57] ABSTRACT

The present invention relates to a MOS transistor having floating source regions and floating drain regions.

An epitaxial layer is grown on the channel regions of a semiconductor substrate in such a manner that the surface of the epitaxial layer makes a plane together with the upper surface of field oxide films, thereby enabling steps to be reduced.

A polysilicon film is filled in recess regions formed by the growth of epitaxial layer and impurity-ions are implanted into the polysilicon film to form floating source regions and a floating drain regions.

A buried oxide film is formed such a manner that it encloses the polysilicon film filled in the recess regions to prevent the junction leakage and to improve the characteristic of insulation.

10 Claims, 12 Drawing Sheets

METHOD OF MAKING A SEMICONDUCTOR DEVICE HAVING FLOATING SOURCE AND DRAIN REGIONS

BACKGROUND OF THE INVENTION

The present invention relates to a semiconductor device and a method of making the same, and more particularly to a metal oxide semiconductor transistor and a method of making the same which can improve the junction leakage current and the insulation characteristic by floating a source region and a drain region.

FIGS. 1A to 1F are sectional views showing a method for making a general metal oxide semiconductor (MOS) transistor having a n-type.

Figure 1A:
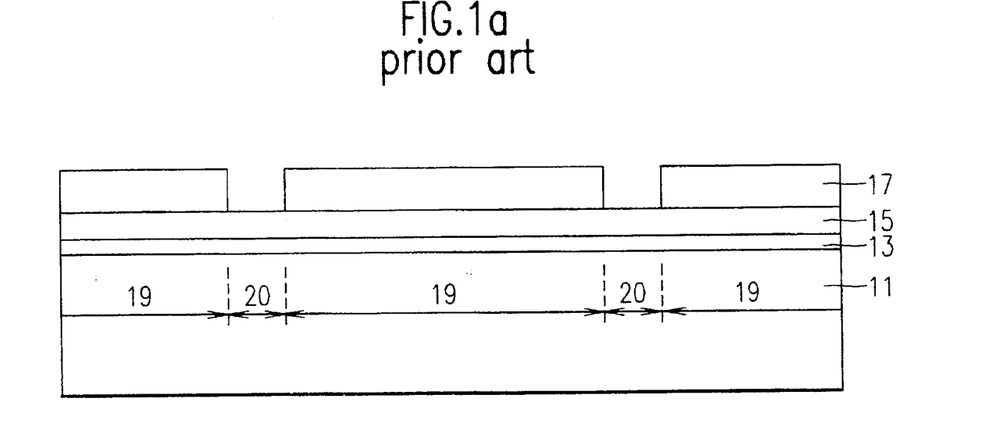

Referring to FIG. 1A, a pad oxide 13 and a pad nitride film 15 and a p type of substrate 11, in this order.

A photoresist 17 is coated on the pad nitride film 15 and then patterned, to define active regions 19 and field regions 20.

Figure 1B:
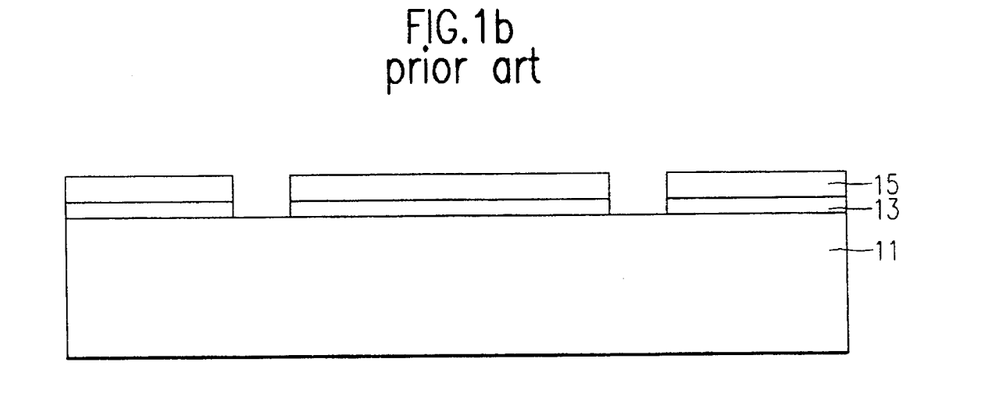

Referring to FIG. 1B, the pad nitride film 15 and the pad oxide film 13 are etched in this order using the patterned photo resist as an etch mask, to expose the silicon substrate 11 corresponding to the field regions and the patterned photo resist is then removed.

Figure 1C:
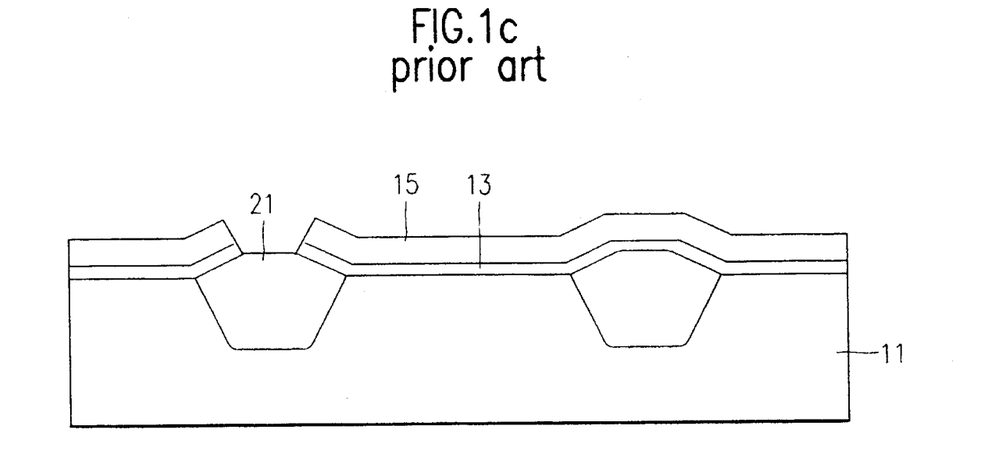

Referring to FIG. 1C, an oxide film is grown on the exposed silicon substrate 11 using a field oxidation process, thereby causing field oxide films 21 for device seperation to be formed thickly.

Figure 1D:
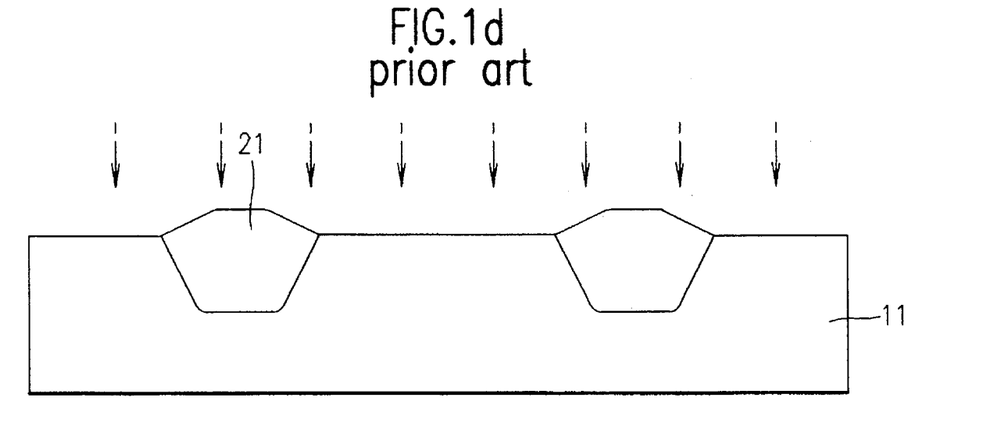
Figure 1E:
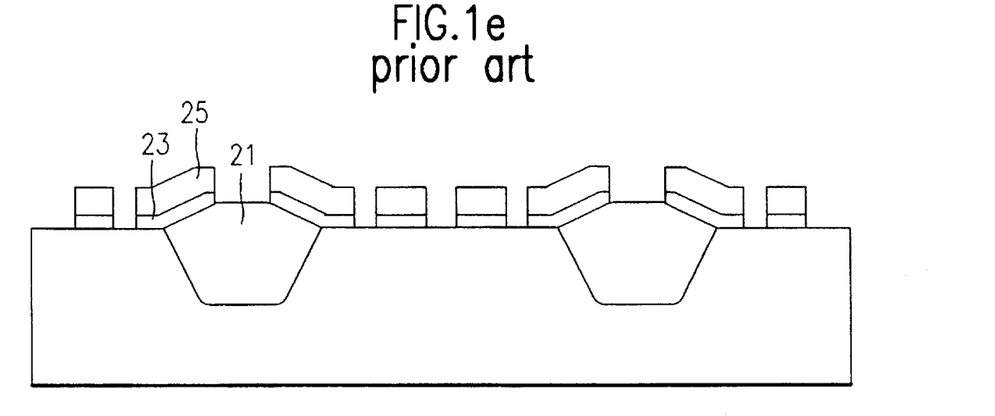

Referring to FIG. 1d, the pad oxide film 13 for field oxidation and the pad nitride film 15 are all removed and impurity ions are then implanted into the silicon substrate 11 to control the threshold voltage $V_{th}$. Referring to FIG. 1E, a thin oxide film 23 is grown on the silicon substrate 11 and a polysilicon film 25 is then deposited on the thin oxide film 23.

Thereafter, the thin oxide film 23 and the polysilicon film 25 are patterned to form gate oxide films and gate electrodes.

Figure 1F:
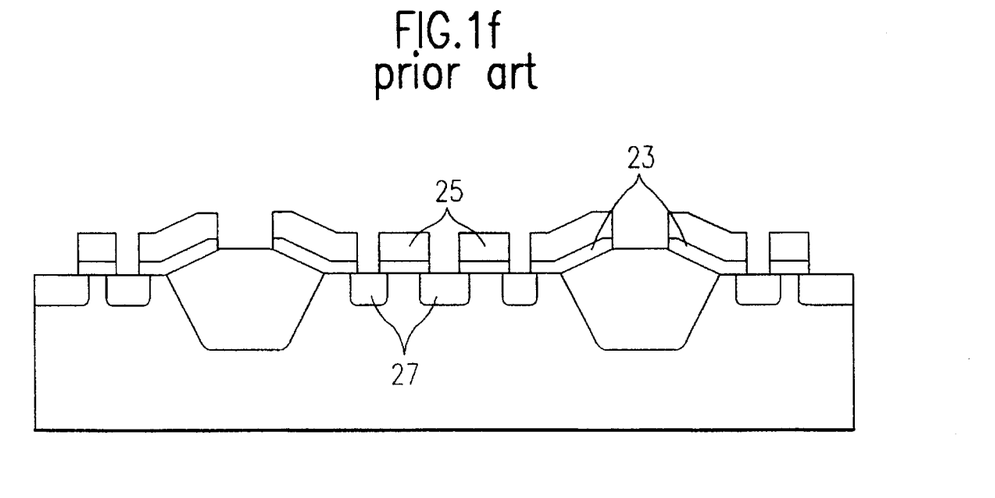

As shown in FIG. 1F, n-type of impurity ions are implanted in the silicon substrate 11 using the gate electrode as an ion-implantation mask, to form source regions 27 and drain regions 27.

However, since the MOS transistor shown in FIG. 1F does merely use the field oxide films 21 as the seperation regions for electrically seperating devices, there is a disadvantage in that the seperation region has a great loss in plane.

Since n-type of impurity diffusion regions serving as the source regions 27 and the drain regions 27 are directly formed on the p-type of silicon substrate 11, thereby resulting PN junction to be formed, there is a disadvantage in that the PN junction served as several leakage paths.

As shown in FIG. 1D. since the field oxide film 21 is also thickly formed, thereby causing steps between the field oxide 21 and the silicon substrate 11 to be formed considerably highly, there is a disadvantage in that it is difficult to perform a following process due to the steps.

The demand to the reduction in the size of device has reduced the size of respective transistor formed in a large scale integrated(LSI).

However, the regions between transistors has also been reduced in size due to the reduction in size of respective transistor.

In a high-integrated MOS transistor which used a thick oxide films as the device seperation regions between transistors, there is a disadvantage in that the punch-through phenomenon may be occurred between transistors as the regions between transistors become still more close.

A method for solving the punch-trough has been suggested.

This method dopes impurity ions into a silicon substrate with a high concentration, such that the surface concentration of silicon substrate between transistor becomes high.

According to this method, however, there is a disadvantage in that the junction capacitance is increased and the increasing of junction capacitance does moreover have a bad influence on the operation of device in high speed as the concentration of substrate is increased.

So as to solve this problem, there has been proposed a semiconductor device such as silicon on insulator (SOI) in which an insulation film is formed on a silicon substrate to insulate the active regions from the silicon substrate electrically.

Figure 2:
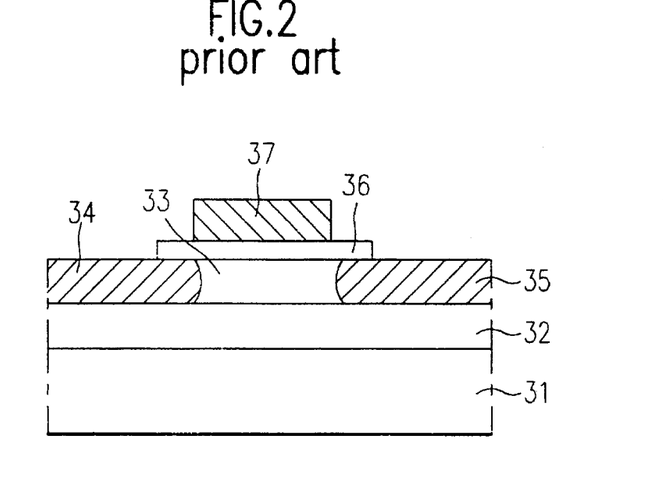
FIG. 2 is a sectional view showing the structure of a conventional SOI MOS transistor.

FIG. 2 is to show a sectional view of a general SOI semiconductor device.

Reference number 31 denotes a silicon substrate, 32 denotes a buried oxide film for insulating a p-type of silicon active region 33 from the silicon substrate electrically, 34 and 35 denotes a n-type of source region and n-type of drain region respectively, 36 denotes a thin oxide film which is a gate insulation film and 37 denotes a gate electrode.

According to the above MOS transistor, its active regions 33 are depleted in accordance with a voltage applied to the gate electrode 37, it is possible not only to restrain the electric field of drain applied to between the drain region 35 and the active region 33 but also to restrain the short channel effect of threshold voltage.

If the thickness of the buried oxide film 32 beneath the drain region 35 is increased, it is also possible to reduce the capacitance of parasitic junction.

Therefore, the SOI MOS transistor has an advantage capable of obtaining the degree of high integration and the operation characteristic of high speed.

However, if the thickness of buried oxide film 32 beneath the active layer 33 is too much thick, the electric field of drain region has a bad influence adversely on the distribution of electric field at the active region 33, thereby causing the short channel effect to be increased.

On the other hand, if the thickness of buried oxide film 32 beneath the active layer 33 becomes thinner than that of FIG. 2, it is possible to restrain the short channel effect. But the parasitic capacitance is increased in accordance with the reduction of thickness of buried oxide film 32 beneath the drain region 35.

Therefore, it is impossible to obtain the operation-characteristic of high speed.

SUMMARY OF THE INVENTION

Therefore, an object of the invention is to provide a MOS transistor having a floating source region and a floating drain region and a method of making the same, capable of improving the junction leakage current and the characteristic of insulation.

In accordance with the present invention, this object can be accomplished by providing a MOS transistor comprising:

a semiconductor substrate in which field regions and channel regions are defined;

a thick field oxide film formed on the field region of the semiconductor substrate;

a first semiconductor layer in which its surface forms a plane together with the upper surface of the field oxide film and it provides a recess part on the semiconductor substrate by being formed merely on the channel regions;

a second semiconductor layer filled completely in the recess part;

an insulation film formed on the lower surface of the second semiconductor layer, wherein its one side is adjacent to the field oxide film;

a gate oxide film formed on the surface of the first semiconductor layer and the upper surface of the second semiconductor layer adjacent to the field oxide film; and a gate electrode formed on the gate oxide film.

The above-object can be also accomplished by a providing a method of making a MOF transistor comprising the steps of:

forming field oxide film on a semiconductor substrate;

forming an oxide film and a nitride film on the whole surface of the semiconductor substrate including the surface of the field oxide film, in this order;

coating a photo resist film on the nitride film and then patterning the photo resist film to define channel regions;

etching the nitride film and the oxide film using the patterned photoresist as an etch mask, to expose the surface of the semiconductor substrate corresponding to the channel regions;

forming epitaxial layers on the exposed surface of semiconductor substrate to provide recess regions;

implanting impurity-ions for the control of threshold voltage into the semiconductor substrate through the epitaxial layers;

removing the remained oxide film and nitride film to expose the semiconductor substrate except for the channel regions;

forming spacers at the side walls of the epitaxial layer;

forming a buried oxide film on the exposed surface on the semiconductor substrate and the epitaxial layer;

removing the spacers;

depositing a polysilicon film thickly such that the recess region is completely filled and then etching-back recess region is completely filled and then etching-back the polysilicon film to flatten the whole surface;

forming a gate oxide film and a gate on the surface of the polysilicon film adjacent to the epitaxial layers and the field oxide film, in this order; and implanting impurity-ions into the polysilicon film filled in the recess region using the gate as an ion-implantation mask to form source region and a drain regions.

BRIEF DESCRIPTION OF THE DRAWINGS

The above and other objects, features and advantages of the present invention will be more clearly understood from the following detailed description taken in conjunction with the accompanying drawings, in which:

FIG. 1A to 1F are sectional views showing a method of making a conventional MOS transistor;

FIG. 3A to 3M are sectional views showing a method of making a MOS transistor in accordance with a first embodiment of the present invention;

FIG. 4A to 4M are sectional views showing a method of making a MOS transistor in accordance with a second embodiment of the present invention;

DETAILED DESCRIPTION OF THE PREFERRED EMBODIMENTS

Referring to FIGS. 3A to 3M, there is illustrated a method of making a MOS transistor in accordance with a first embodiment of the present invention.

Figure 3A:
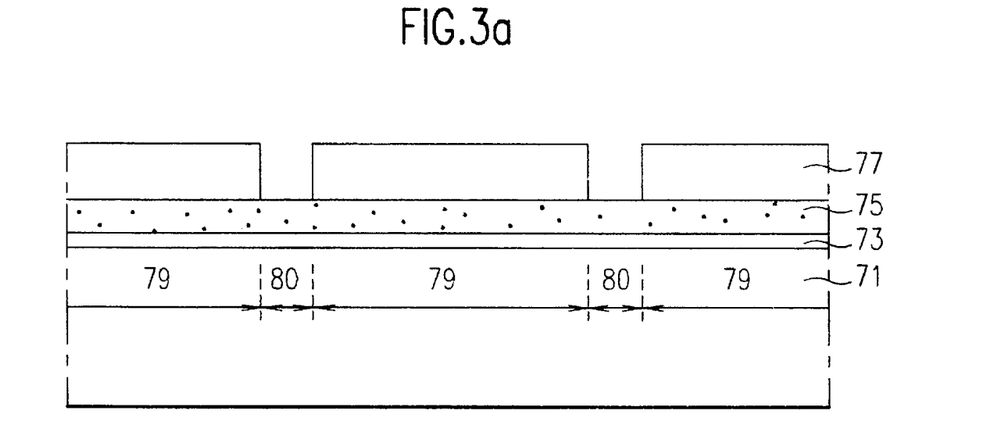

Referring to FIG. 3A, a first oxide film 73 and a first nitride film 75 are formed on a p-type of silicon substrate 71, in this order.

A photo-resist film 77 is coated on the nitride film 75 and then patterned to define active regions 79 and field regions.

Figure 3B:
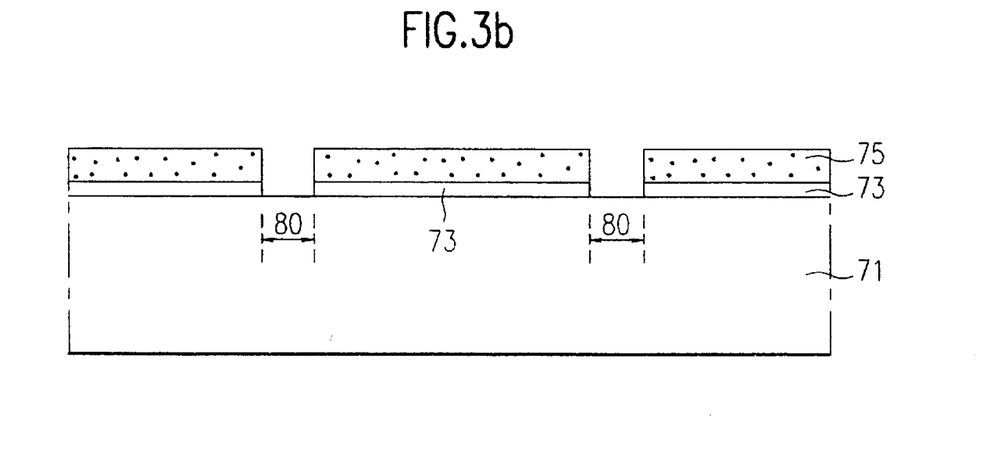

Referring to FIG. 3B, the first nitride film 75 and the first oxide film 73 are etched on the field regions 80 using the patterned photo-resist film 77 as an etch mask, to expose the corresponding silicon substrate 71.

Figure 3C:
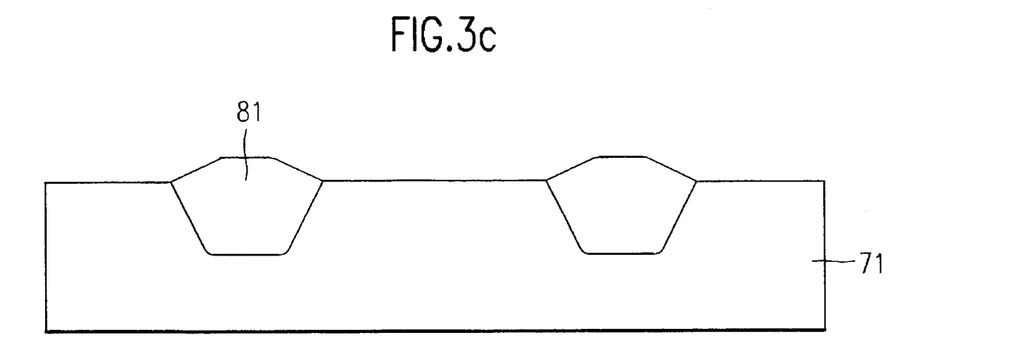

Referring to FIG. 3C, a field oxidation process is carried out to grow a field oxide films 81 on the exposed silicon substrate 71.

After the field oxide films 81 are formed, the remained first nitride film 75 and first oxide film 73 are all removed.

Figure 3D:
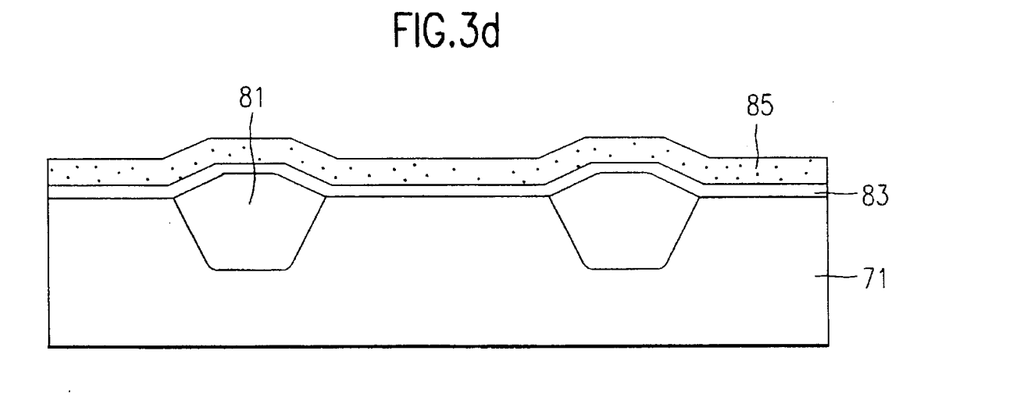
Figure 3E:
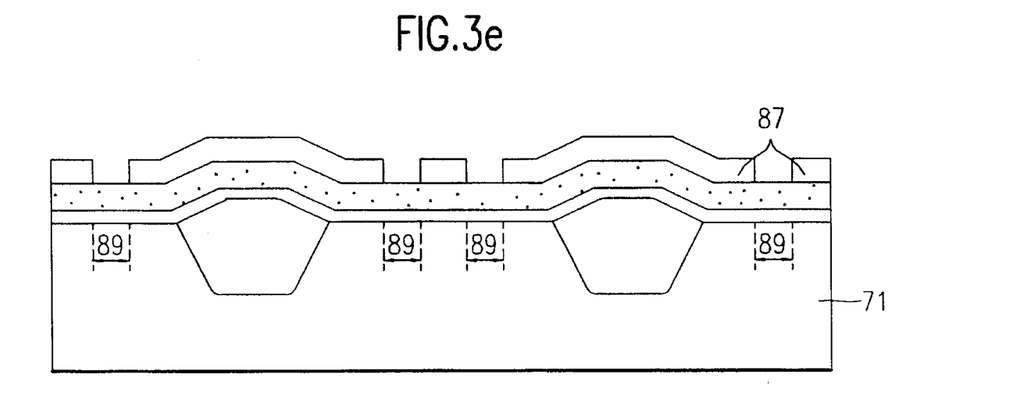
Figure 3F:
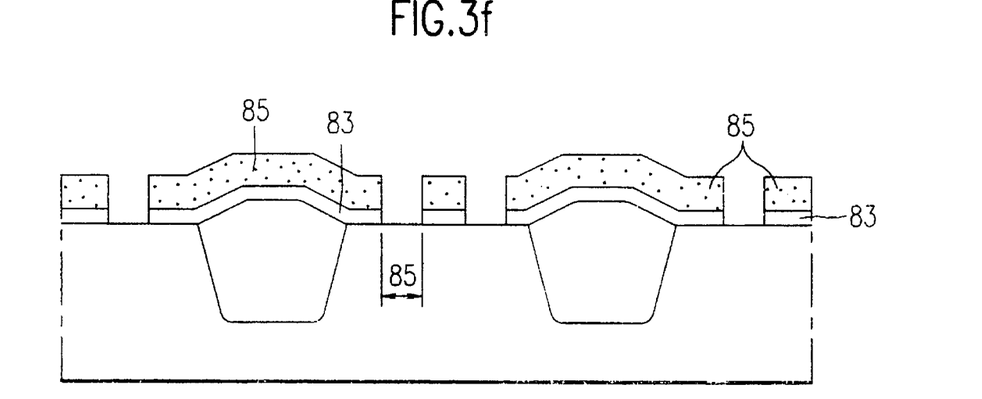

FIGS. 3D to 3F are to show a process for forming an epitaxy mask layer.

As shown in FIG. 3D, a second oxide film 83 and a second nitride film 85 on the whole surface of the substrate, in this order.

Thereafter, a photo-resist film 87 is coated on the second nitride film 85 and the photo-resist film 87 is patterned using a mask for pattern shown in FIG. 5 to define channel regions 89, as shown in FIG. 3E.

In case of using the pattern mask shown in FIG. 5, that is, the photo-resist film 87 except for the channel regions 89 is remained and the photo-resist film 87 corresponding to the channel regions 89 is removed by a photolithography and etch process, using a positive photo-resist film 87.

Subsequently, the second nitride film 85 and the second oxide film 83 are etched using the photo-resist film 87 as an etch mask to expose the silicon substrate 71 corresponding to the channel regions 89, as shown in FIG. 3F.

Figure 3G:
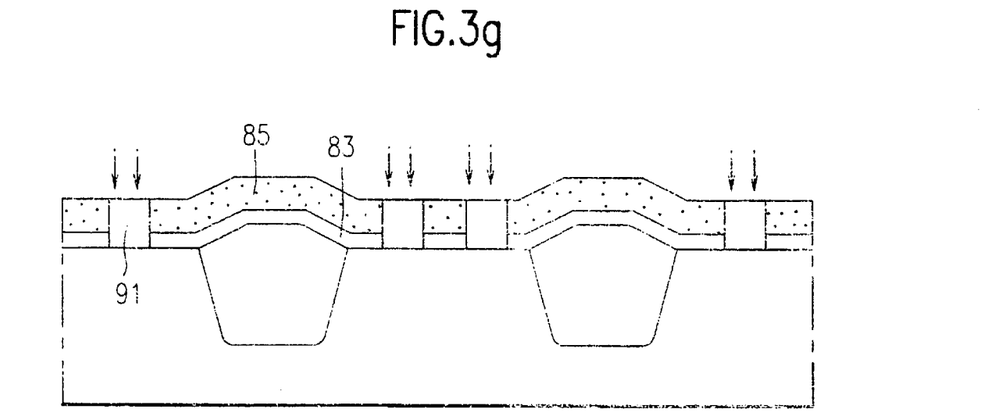

Referring to FIG. 3G, epitaxial layers 91 are grown on the exposed silicon substrate 71 using the second oxide film 83 and the second nitride film 85 as a mask.

Thereafter, impurity-ions are implanted into the silicon substrate 71 to control the threshold voltage $V_{th}$.

Figure 3H:
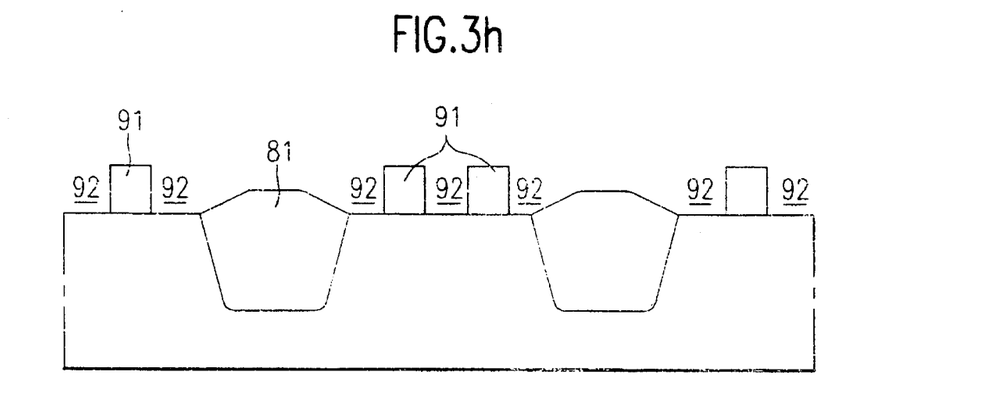

Referring to FIG. 3H, the second oxide film 83 and the second nitride film served as the mask layers for epitaxy are all removed.

Therefore, the silicon substrate 71 has recess regions 92 by the growth of the epitaxial layers 91.

Figure 3I:
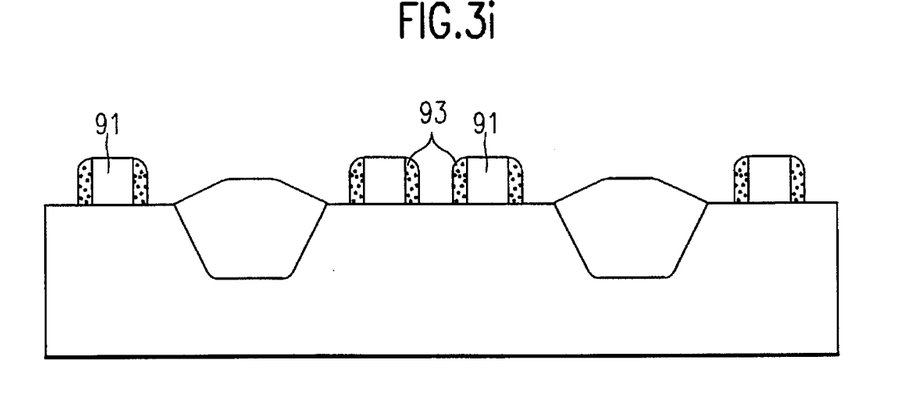

As shown in FIG. 3I, a third nitride film is deposited on the whole surface of the silicon substrate 71 and then etched by an anisotropic etching method such as reactive ion etching, to form nitride spacers 93 at the side walls of the epitaxial layers 91.

Figure 3J:
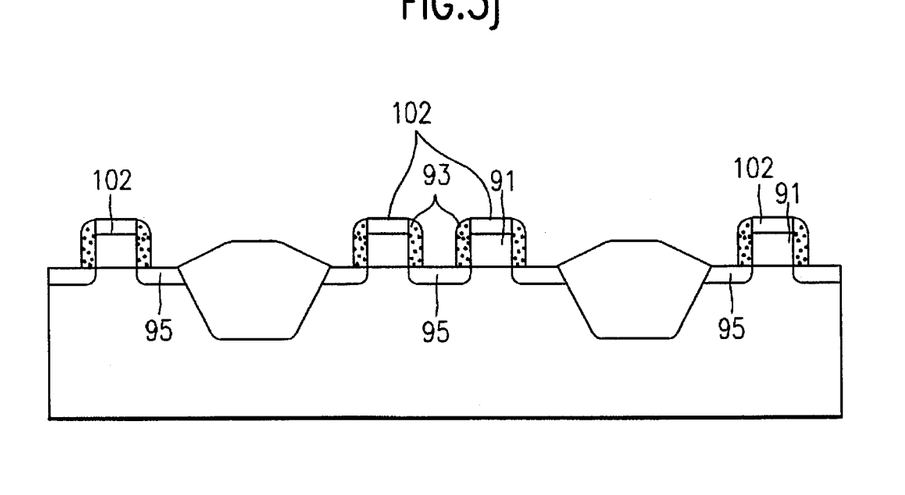

As shown in FIG. 3J, a buried oxide film 95 is formed on the surfaces of the exposed silicon substrate 71 and the buried oxide film 102 is formed on the epitaxial layer 91.

The buried oxide films 95 and 102 may be formed by oxidizing the epitaxial layer 91 or the exposed surface of substrate 71 and be also formed by depositing with a chemical vapour deposition(CVD) method.

Figure 3K:
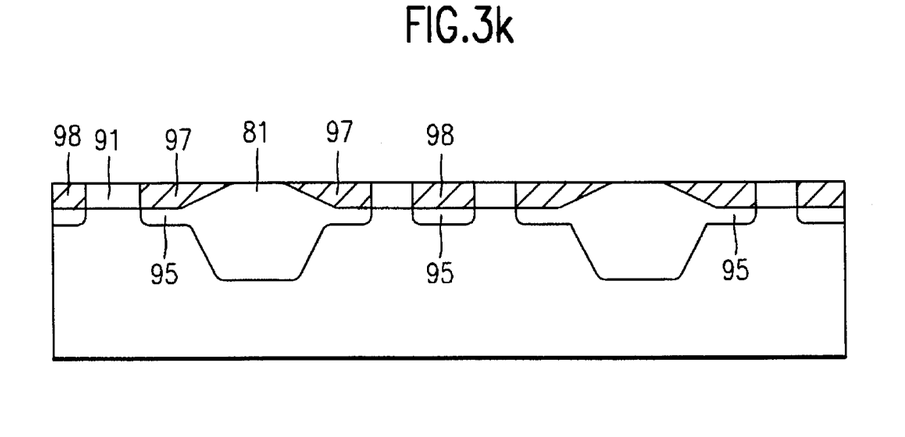

Referring to FIG. 3K, the nitride film spacers 93 are all removed and a polysilicon film 97 is then deposited thickly on the whole surface of the substrate.

Thereafter, the polysilicon film 97 is etched by an etch-back process until the surface of the field oxide films 81 is exposed.

At this time, since the recess regions 92 are completely filled with the polysilicon film 97, the whole surface of the silicon substrate 71 is flattened.

Figure 3L:
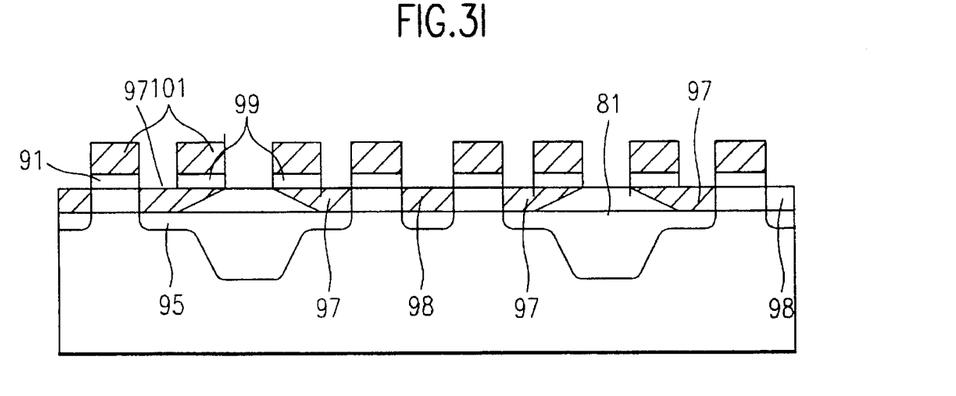

Referring to FIG. 3L, a thin oxide film and a polysilicon film are deposited on the whole surface of the silicon substrate 71, in this order and then patterned to form gate oxide films 99 and gates 101 on the epitaxial layer, in this order.

Figure 3M:
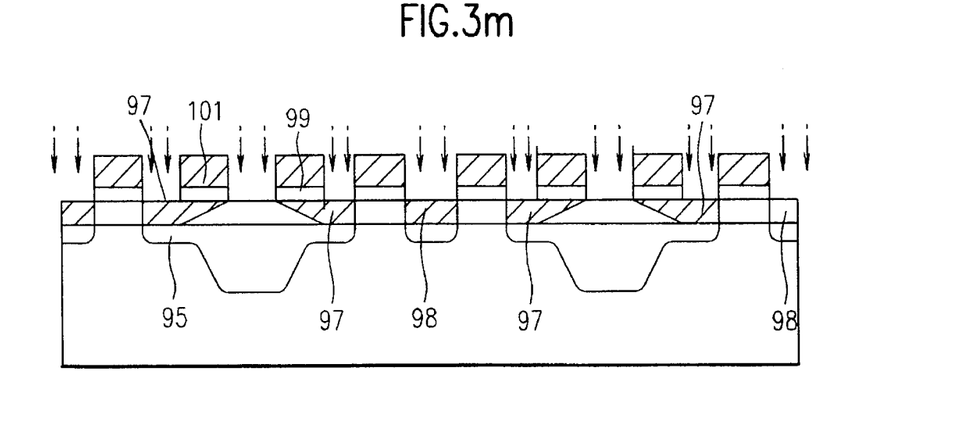

Referring to FIG. 3M, impurity-ions are implanted into the polysilicon film 97 filled in the recess region 92 using the gate 101 as an ion-implantation mask.

The polysilicon films 97 and 98 implanted with impurity ions serve as source regions and drain regions of a MOS transistor.

Referring to FIGS. 4A to 4M, there is illustrated a method of making a MOS transistor in accordance with a second embodiment of the present invention.

Figure 4A:
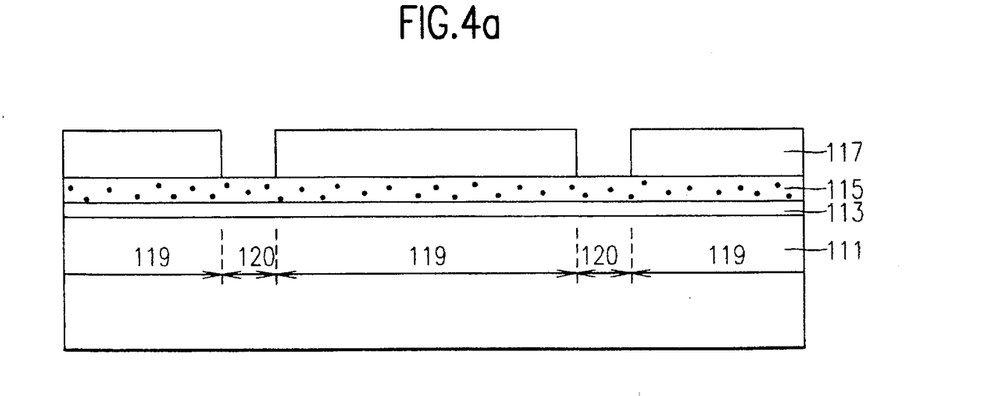

Referring to FIG. 4A, a first oxide film 113 and a first nitride film 115 are on a silicon substrate 111, in this order. Thereafter, a photo-resist film 117 is coated and then patterned to form active regions 119 and field regions 120.

Figure 4B:
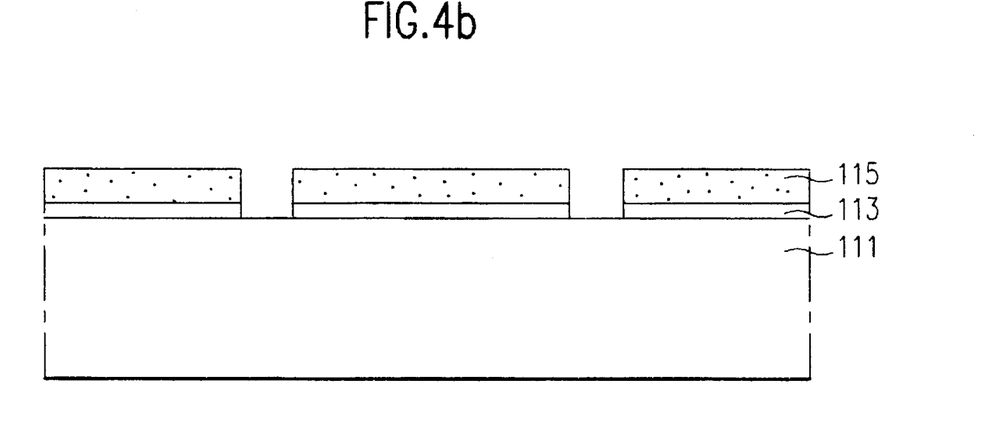

Referring to FIG. 4B, the first nitride film 115 and the first oxide film 113 are etched to expose the silicon substrate 111 corresponding to the field regions 120.

Subsequently, the remained photo-resist film 117 is removed.

Figure 4C:
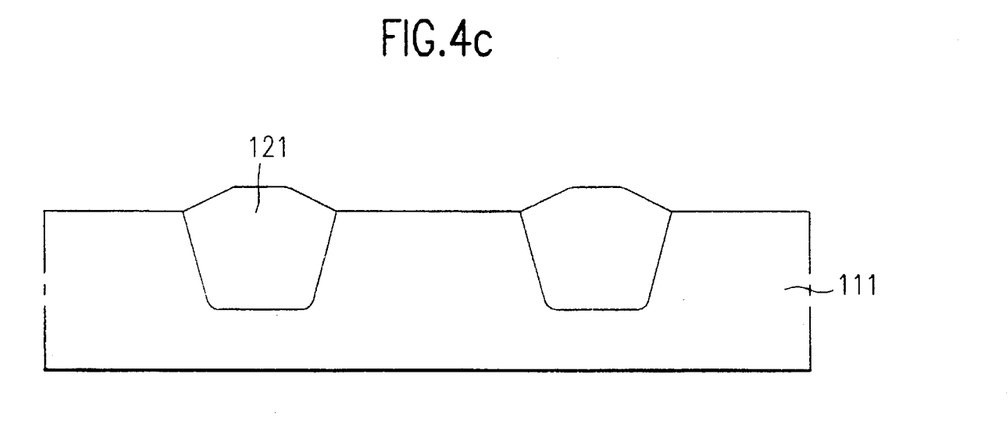

As shown in FIG. 4C, a field oxidation process is carried out to form field oxide films 121.

Figure 4D:
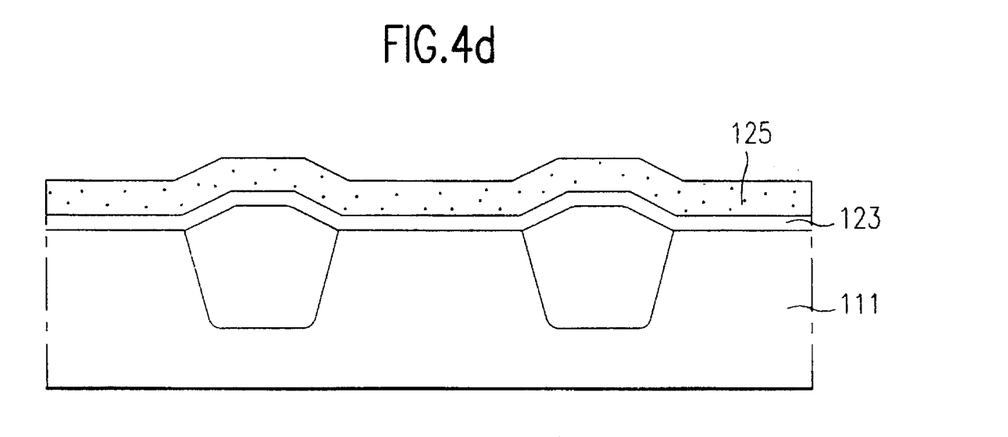

Referring to FIG. 4D, after the field oxide films 121 are formed, a second oxide film 123 and a second nitride film 125 to be used as mask layers for substrate-etching are formed on the whole surface of the silicon substrate 111.

Figure 4E:
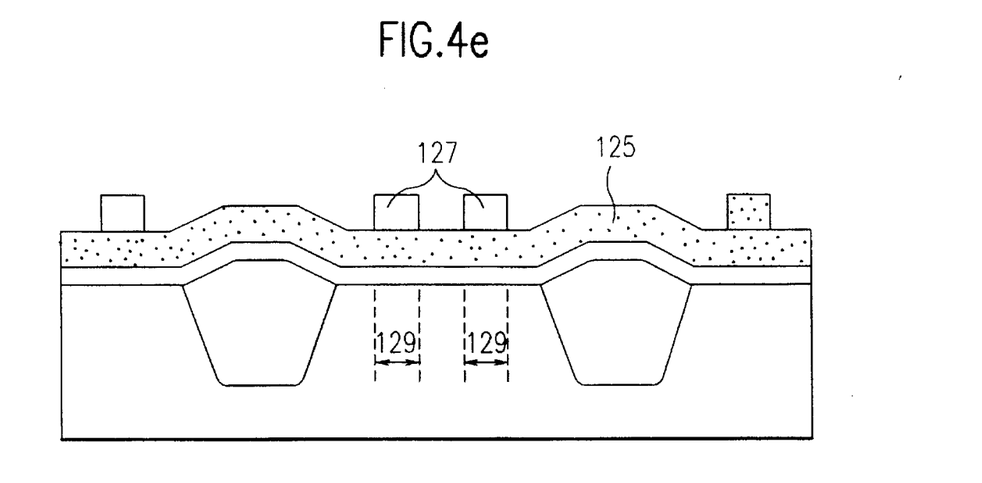

Referring to FIG. 4E, a photo-resist film 127 is again coated on the second nitride film 125 and then patterned using a pattern mask shown in FIG. 5.

Therefore, channel regions 129 are defined.

At this time, the second embodiment does all remove the photo-resist film 127 except for the channel regions 129 with a photolithography and etching method using a negative photoresist film and remain the photo-resist film 127 disposed on the channel regions 129.

Figure 4F:
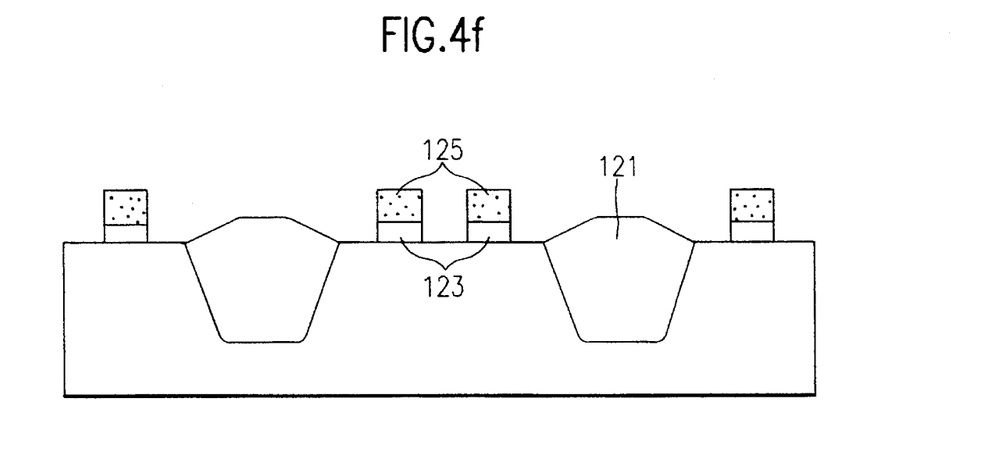

Referring to FIG. 4F, the second nitride film 125 and the second oxide film 123 are etched using the photo-resist film as an etch mask to expose the silicon substrate 111.

Thereafter, the remained photo-resist film 127 is removed.

Figure 4G:
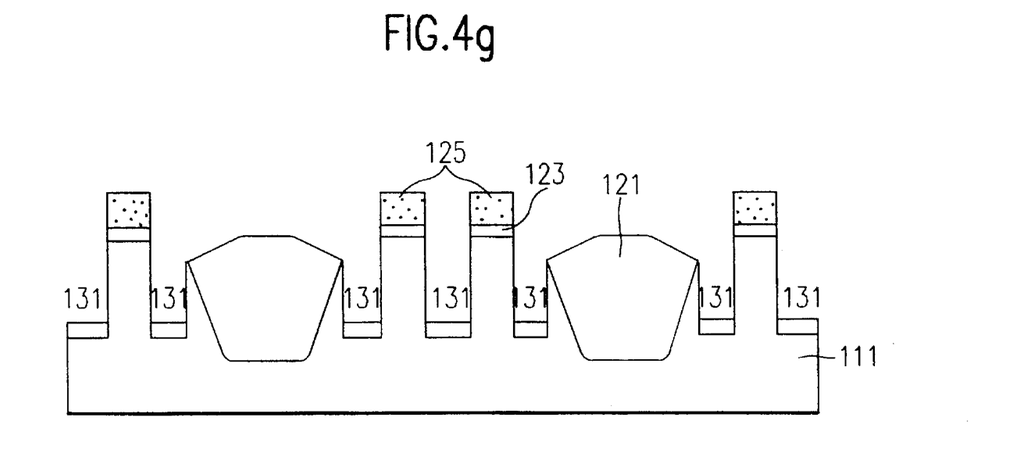

As shown in FIG. 4G the exposed silicon substrate 111 is etched using the second nitride film 125 and the second oxide film 125 as an etch mask to form trenches 131.

Figure 4H:
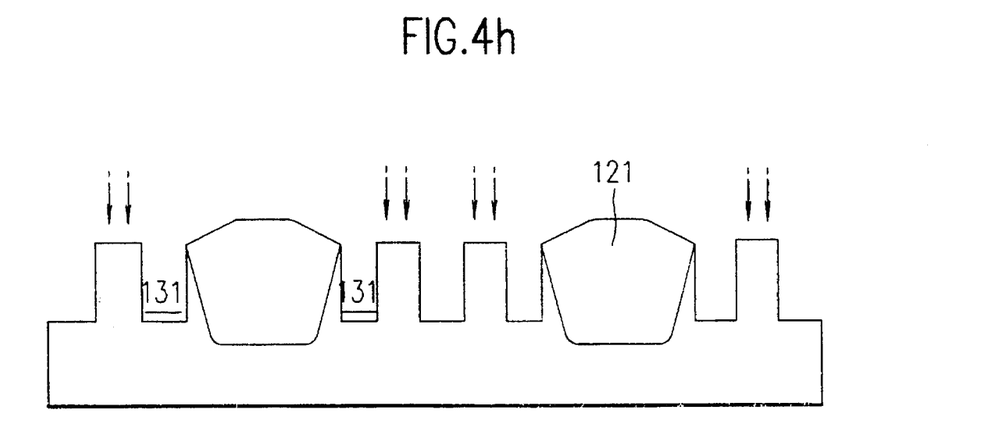

As shown in FIG. 4H, the second nitride film 125 and second oxide film 123 served as the etch mask are all removed and an implantation process of impurity-ions in carried out to control the threshold voltage $V_{th}$.

Figure 4I:
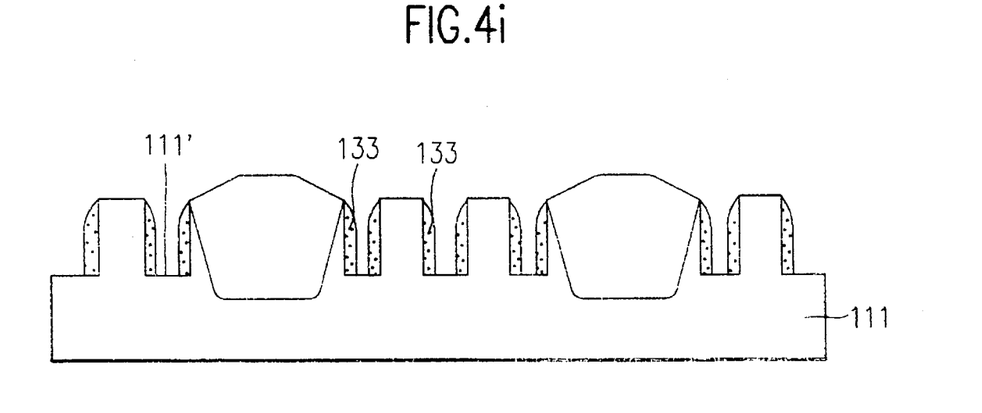

As shown in FIG. 4I, a nitride film is formed on the whole surface of the substrate and then etched by an anisotropic etching method to form nitride film spacers 133 at the side walls of the trenches 131.

Figure 4J:
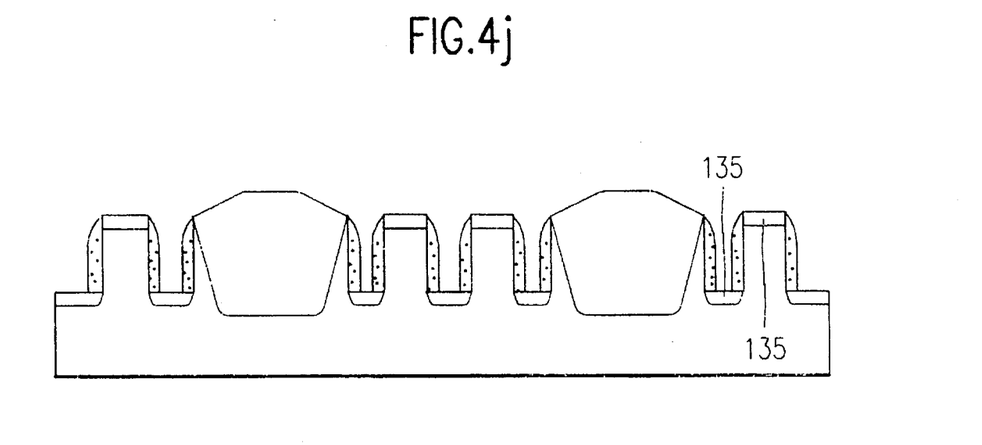

As shown in FIG. 4J, a buried oxide film 135 is formed on the exposed silicon substrate 111 and on the silicon substrate 111' in the trenches 131.

The buried oxide film 135 may be formed by oxidizing the exposed silicon substrate 111 and 111', or be formed on the silicon substrate 111 and 111' by depositing with a CVD method.

Figure 4K:
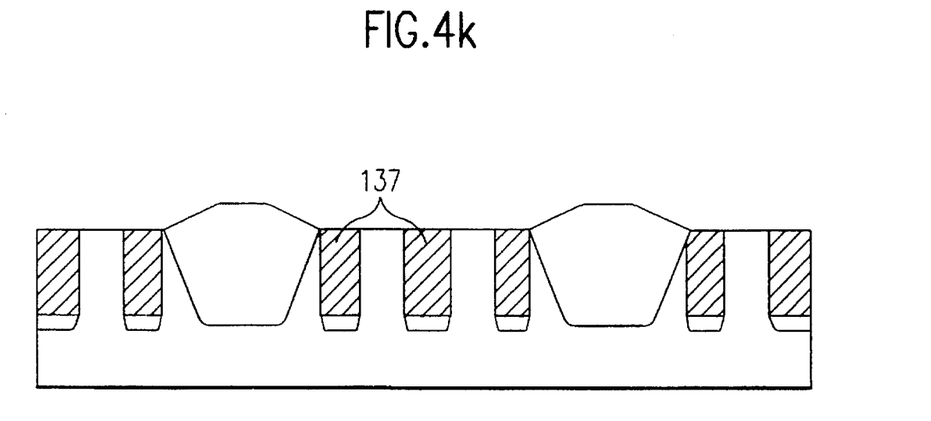

Referring to FIG. 4K, a polysilicon film 137 is deposited thickly on the substrate and then etched-back until the silicon substrate 111 is exposed, to flatten the surface of the silicon substrate 111.

As this time, the trenches 131 are completely filled with the polysilicon film 137.

The buried oxide film 135 disposed on the silicon substrate 111 is removed upon performing the above etch-back while the buried oxide film 135 is merely remained.

Figure 4L:
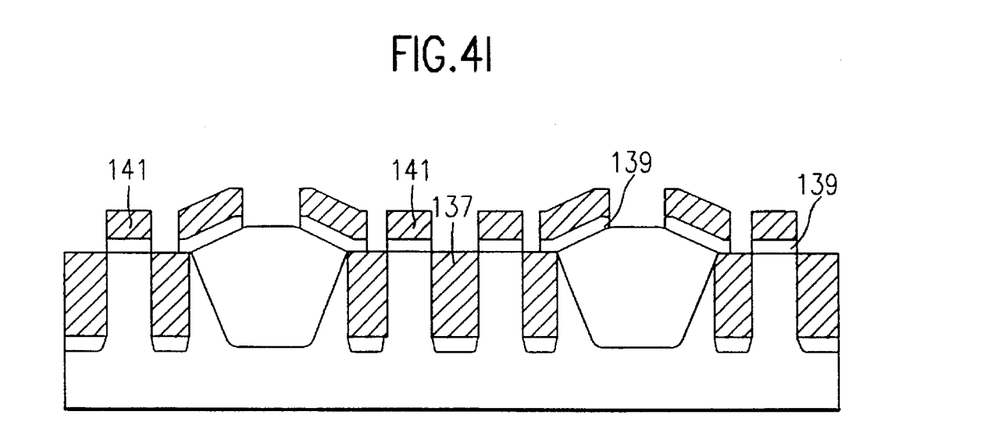

As shown in FIG. 4L, a thin oxide film and a polysilicon film are formed on the silicon substrate 111 and then patterned to form gate oxide films 139 and gates 141.

Figure 4M:
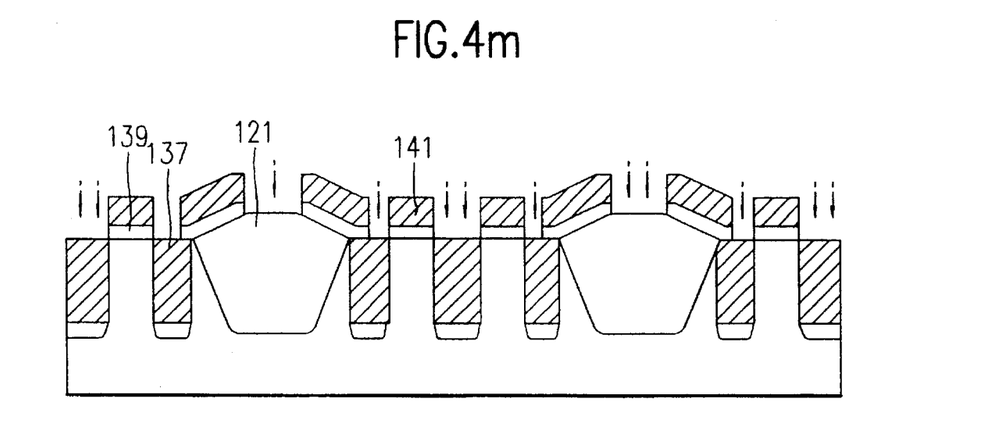

As shown in FIG. 4M, impurity-ions are implanted into the polysilicon film 137 filled in the trench using the gates as an ion-implantation mask, to form source regions and drain regions.

In case that the above MOS transistor is a n-type of MOS transistor, n-type of impurity-ions are implanted into the p-type of silicon substrate to form n-type of source regions and n-type of drain regions.

On the contrary, in case that the above-MOS transistor is p-type of MOS transistor, p-type of impurity-ions are implanted into n-type of silicon substrate to form p-type of source regions and p-type of drain regions.

FIG. 5 is diagrams showing a pattern mask used in the first embodiment and second embodiment of the present invention.

Figure 5A:
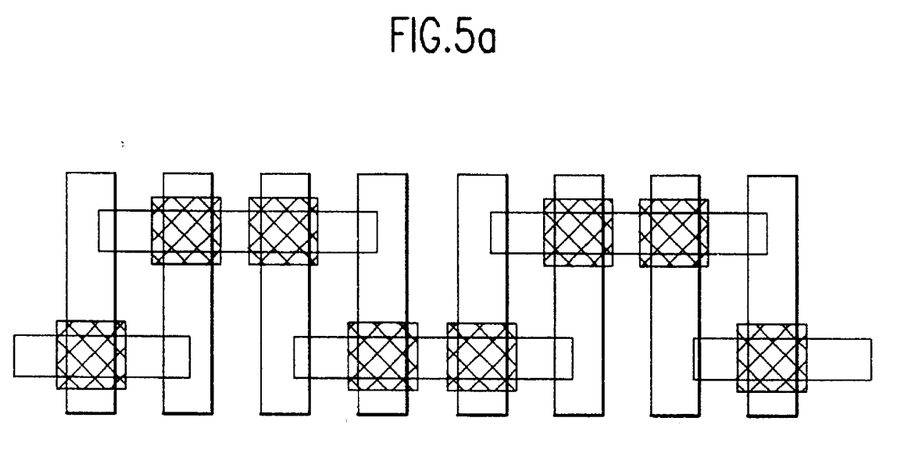
FIG. 5A is a diagram showing a pattern mask used in the present invention, in case that cells are arranged in a conventional direction.

First, FIG. 5A is a diagram showing a pattern mask in case of arranging cells conventionally.

Figure 5B:
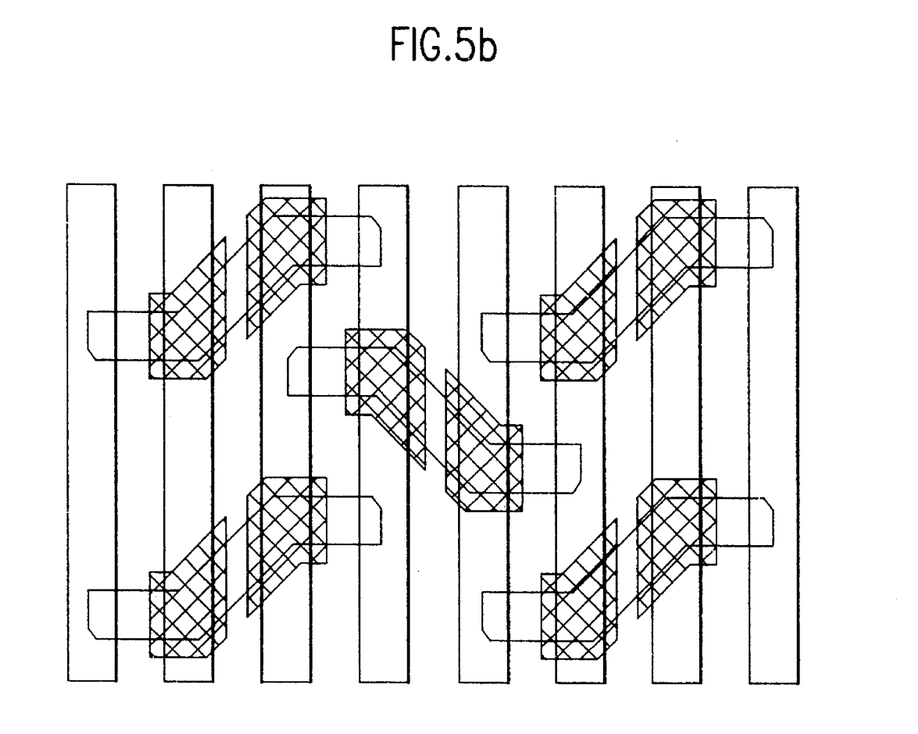
FIG. 5B is a diagram showing a pattern mask used in the present invention, in case that cells are arranged in a diagonal direction.

Second, FIG. 5B is a diagram showing a pattern mask in case of arranging cells in a diagonal direction.

As above described, the following effects can be obtained in accordance with the present invention.

First, since a thin buried oxide film is formed just beneath floating source regions and floating drain regions and the thin buried oxide film does thus encompass the source region and drain region, the junction leakage can be reduced.

Second, since the buried oxide film formed just beneath the floating source regions and drain regions performs a function same as that of a field oxide film for device seperation, it is possible to reduce the square area of isolation region that is, field region.

Third, since the source regions and drain regions make a plane together with the surface of the field region, steps between them can be reduced.

Therefore, the subsequent photolithography processes can be performed easily.

What is claimed is:

1. A method of making a semiconductor device, comprising the steps of:

forming field oxide films on a semiconductor substrate;

forming an oxide film on said semiconductor substrate;

forming a nitride film on said oxide film;

coating a photoresist film on said nitride film;

patterning said photoresist film to define channel regions;

etching said nitride film and said oxide film on said channel regions using said photoresist film as an etch mask;

forming epitaxial layers on said channel regions;

implanting impurity ions of a first type for controlling a threshold voltage into said semiconductor substrate;

removing said nitride film and said oxide film to provide recess regions on said semiconductor substrate;

forming spacers at sidewalls of said epitaxial layers;

forming buried oxide films on said semiconductor substrate and said epitaxial layers;

removing said spacers;

depositing a polysilicon film on said buried oxide films that are formed on said semiconductor substrate;

etching back said polysilicon film to fill said recess regions with said polysilicon film;

forming a gate oxide film on said polysilicon film and said epitaxial layers;

forming gates on said gate oxide film corresponding to said epitaxial layers; and implanting impurity ions of a second type into said polysilicon film filled in said recess regions, to form source and drain regions.

2. The method of claim 1 wherein said photoresist film is a positive type.

3. The method of claim 1 wherein said nitride film and said oxide film serve as a mask upon forming said epitaxial layers.

4. The method of claim 1 wherein said buried oxide films are formed by oxidizing the exposed silicon substrate and the exposed epitaxial layer.

5. The method of claim 1 wherein said buried oxide films are deposited by a CVD method.

6. The method of claim 1 wherein said spacers serve as oxide mask layers upon forming said buried oxide films.

7. The method of claim 6 wherein said spacers are made of a nitride film.

8. The method of claim 1 wherein said field oxide films serve as an etch-stopper upon etching said polysilicon film.

9. A method of making a semiconductor device, comprising the steps of:

forming field oxide films on a semiconductor substrate;

forming an oxide film on said semiconductor substrate;

forming a nitride film on said oxide film;

coating a photoresist film on said nitride film;

patterning said photoresist film to define channel regions;

etching said nitride film and said oxide film except for said channel regions using said photoresist film as an etch mask;

etching said semiconductor substrate using said nitride film and said oxide film as etching mask to form trenches;

removing said nitride film and said oxide film;

implanting impurity ions of a first type for controlling a threshold voltage into said semiconductor substrate;

forming spacers at sidewalls of said trenches;

forming insulating films on said channel regions and a bottom of said trenches;

removing said spacers;

forming a polysilicon film on said insulating films that are formed on said semiconductor substrate;

etching back said polysilicon film to fill said trenches with said polysilicon film;

forming a gate oxide film on said channel regions said polysilicon film and said field oxide films;

forming gates on said gate oxide film corresponding to said channel regions; and implanting impurity ions of a second type into said polysilicon film filled in said trenches using said gates as an ion implantation mask to form source and drain regions.

10. The method of claim 9 wherein said semiconductor substrate is used as an etch stopper upon etching back said polysilicon film.

* * * * *